(12) United States Patent
Shen et al.

(10) Patent No.: US 6,781,584 B2
(45) Date of Patent: Aug. 24, 2004

(54) RECAPTURE OF A PORTION OF A DISPLAYED WAVEFORM WITHOUT LOSS OF EXISTING DATA IN THE WAVEFORM DISPLAY

(75) Inventors: Hsiu-Huan Shen, Saratoga, CA (US); Stephen Dennis Jordan, Fort Collins, CO (US); Alan S. Krech, Jr., Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 171 days.

(21) Appl. No.: 10/206,441

(22) Filed: Jul. 26, 2002

(65) Prior Publication Data

US 2004/0017371 A1 Jan. 29, 2004

(51) Int. Cl.[7] .................................................. G09G 5/22
(52) U.S. Cl. ..................................... 345/440.1; 345/440
(58) Field of Search ............................. 345/440, 440.1, 345/440.2, 441, 442, 443, 771

(56) References Cited

U.S. PATENT DOCUMENTS 6,522,345 B1 * 2/2003 Alexander ................... 345/440
6,559,868 B2 * 5/2003 Alexander et al. ......... 345/440.1
6,584,419 B1 * 6/2003 Alexander ..................... 702/68

OTHER PUBLICATIONS

Agilent 93000 SOC Series User Training Part 1, Revision 2.2, available from Agilent Technologies, Inc. as Part No. 5968-5522E, 2000, pp. 274–278.

* cited by examiner

Primary Examiner—Matthew Luu

(57) ABSTRACT

A waveform for an input/output signal for a device under test (DUT) is displayed. Data for the input/output signal is captured in accordance with a first data capturing mechanism. The waveform for the input/output signal is displayed using the captured data. A user is provided with an interface that allows the user to select a portion of the waveform for recapture using a second data capturing mechanism. Data for a portion of the input/output signal, corresponding to the portion of the waveform selected for recapture, is recaptured. The recapturing of data is performed using the second data capturing mechanism. The waveform for the input/output signal is redisplayed. The data recaptured using the second data capturing mechanism is used for displaying the portion of the waveform selected for recapture. The data captured in accordance with the first data capturing mechanism is used for displaying remaining portions of the waveform not selected for recapture.

20 Claims, 8 Drawing Sheets

RECAPTURE OF A PORTION OF A DISPLAYED WAVEFORM WITHOUT LOSS OF EXISTING DATA IN THE WAVEFORM DISPLAY

BACKGROUND

The present invention pertains to testing devices and pertains particularly to the recapture of a portion of a displayed waveform without loss of existing data in the waveform display.

After manufacture, circuits are extensively tested to assure proper performance. For example, memory testers are used to test random access memories used in computers and other devices. Testing is typically performed by applying signals to and reading signals from pins of a device under test (DUT). Typically, the pins of a DUT function as address pins, data pins and control pins. The inputs and outputs of a DUT, including address pins, data pins and control pins are referred to herein as input/output pins or simply as pins. Some input/output pins are used just to input signals to the DUT. Other input/output pins are used just to output signals from the DUT. Other input/output pins are used both to input signals to the DUT and to output signals from the DUT.

Some test systems include programs that display waveforms for signals on the input/output pins of a DUT. Various mechanisms are used to capture signals for display.

For example, some test systems can process instructions in the test pattern and read the hardware state information to determine the waveform of signals to be placed on the inputs of the DUT. Similarly, some test systems can process instructions in the test pattern and read the hardware state information to determine the waveform of signals the test system expects to detect at the outputs of the DUT.

Some test systems make measurements at the inputs and/or outputs of a DUT in order to measure actual signals. This allows actual display of input and output signals for a DUT during a test. However, hardware constraints of test systems often limit the resolution at which data is displayed.

For example, a test system may simultaneously test multiple DUTs at one time. Simultaneous testing of up to 36 DUTs is typical. Each DUT has a multitude of input/output pins. DUTs with 64 pins or more are common. It would be time and/or cost prohibitive to use a voltage meter or oscilloscope to determine the exact voltage of every pin of every DUT being tested by a test system. For this reason, test systems typically include a compare circuit for each pin of each DUT being tested to compare the voltage at a pin with a test voltage. A voltage comparison typically can be performed at every pin once per test cycle. For increased voltage resolution of signals, several test cycles can be run and the voltage comparisons can be performed with different test voltages. For increased timing resolution of signals, several test cycles can be run and the voltage comparisons can be performed with different amounts of delay from the beginning of the test cycle.

SUMMARY OF THE INVENTION

In accordance with the preferred embodiment of the present invention, a waveform for an input/output signal for a device under test (DUT) is displayed. Data for the input/output signal is captured in accordance with a first data capturing mechanism. The waveform for the input/output signal is displayed using the captured data. A user is provided with an interface that allows the user to select a portion of the waveform for recapture using a second data capturing mechanism. Data for a portion of the input/output signal, corresponding to the portion of the waveform selected for recapture, is recaptured. The recapturing of data is performed using the second data capturing mechanism. The waveform for the input/output signal is redisplayed. The data recaptured using the second data capturing mechanism is used for displaying the portion of the waveform selected for recapture. The data captured in accordance with the first data capturing mechanism is used for displaying remaining portions of the waveform not selected for recapture.

DESCRIPTION OF THE PREFERRED EMBODIMENT

Figure 1:
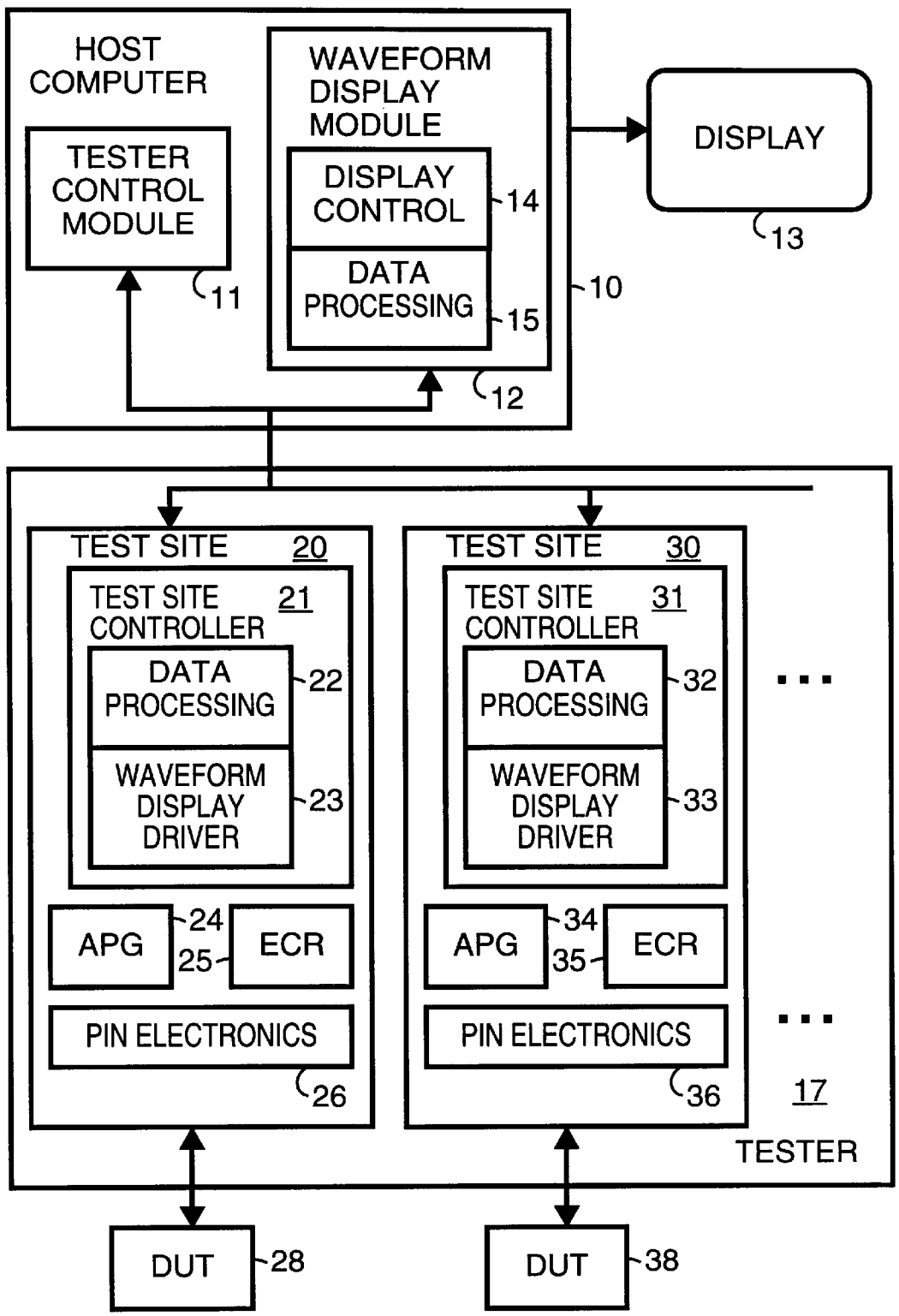
FIG. 1 is a simplified block diagram of a test system in accordance with a preferred embodiment of the present invention.

FIG. 1 is a simplified block diagram that shows a test system. A device under test (DUT) 28, and a DUT 38 represent the devices being tested. In a typical test system, 36 DUTs can be tested at one time.

Each DUT interfaces with a test site within a tester 17. For example, FIG. 1 shows DUT 28 interacting with a test site 20 and DUT 38 interacting with a test site 30.

Test site 20 includes a test site controller 21. Test site controller 21 includes a data processing block 22 and a waveform display driver 23, implemented in software. An algorithmic pattern generator (APG) 24 generates test data used to test DUT 28. Error capture RAM (ECR) includes random access memory (RAM) used to capture error information from DUT 28. Pin electronics 26 includes analog circuitry used to write signals to and read signals from DUT 28.

Depending on the data capture mechanism being used, waveform display driver 23 obtains data from monitoring pins of DUT 28 or from the test instruction memory in APG 24 and the state of test site 20 hardware. Data processing block 22 controls waveform display driver 23 instructing waveform display driver 23 what data to obtain and determining when data is valid. Data processing block 22 also arranges data in a format that waveform display module 12 expects before forwarding the data to waveform display module 12.

Test site 30 includes a test site controller 31. Test site controller 31 includes a data processing block 32 and a waveform display driver 33, implemented in software. An algorithmic pattern generator (APG) 34 generates test data used to test DUT 38. Error capture RAM (ECR) is used 35 is used to capture error information from DUT 38. Pin electronics 36 includes analog circuitry used to write signals to and read signals from DUT 38.

Depending on the data capture mechanism being used, waveform display driver 33 obtains data from monitoring pins of DUT 38 or from the test instruction memory in APG 34 and the state of test site 30 hardware. Data processing block 32 controls waveform display driver 33 instructing waveform display driver 33 what data to obtain and determining when data is valid. Data processing block 32 also arranges data in a format that waveform display module 12 expects before forwarding the data to waveform display module 12.

A host computer 10 includes a tester control module 11 and a waveform display module 12. Tester control module 11 is, for example, implemented as a software module that oversees tests performed by tester 17. Waveform display module 12 includes a data processing block 15 used to process data from tester 17 in preparation to passing the data to a display control block 14. In a preferred embodiment of the present invention, data processing block 15 and display control block 14 are implemented as software modules.

Display control block 14 is used to control display of waveform data on a display 13. The test system also includes a driver module 23 used to provide control of the test site controllers. Waveform display module 12 communicates with a test site to obtain data for display. The data can include test patterns to be placed on input/output pins of a DUT by the test site controller during testing, test results expected to be placed on the input/output pins by a DUT during testing, and/or actual signals measured on the input/output pins of a device under test. Waveform display module 12 displays waveforms on display 13.

Figure 2:
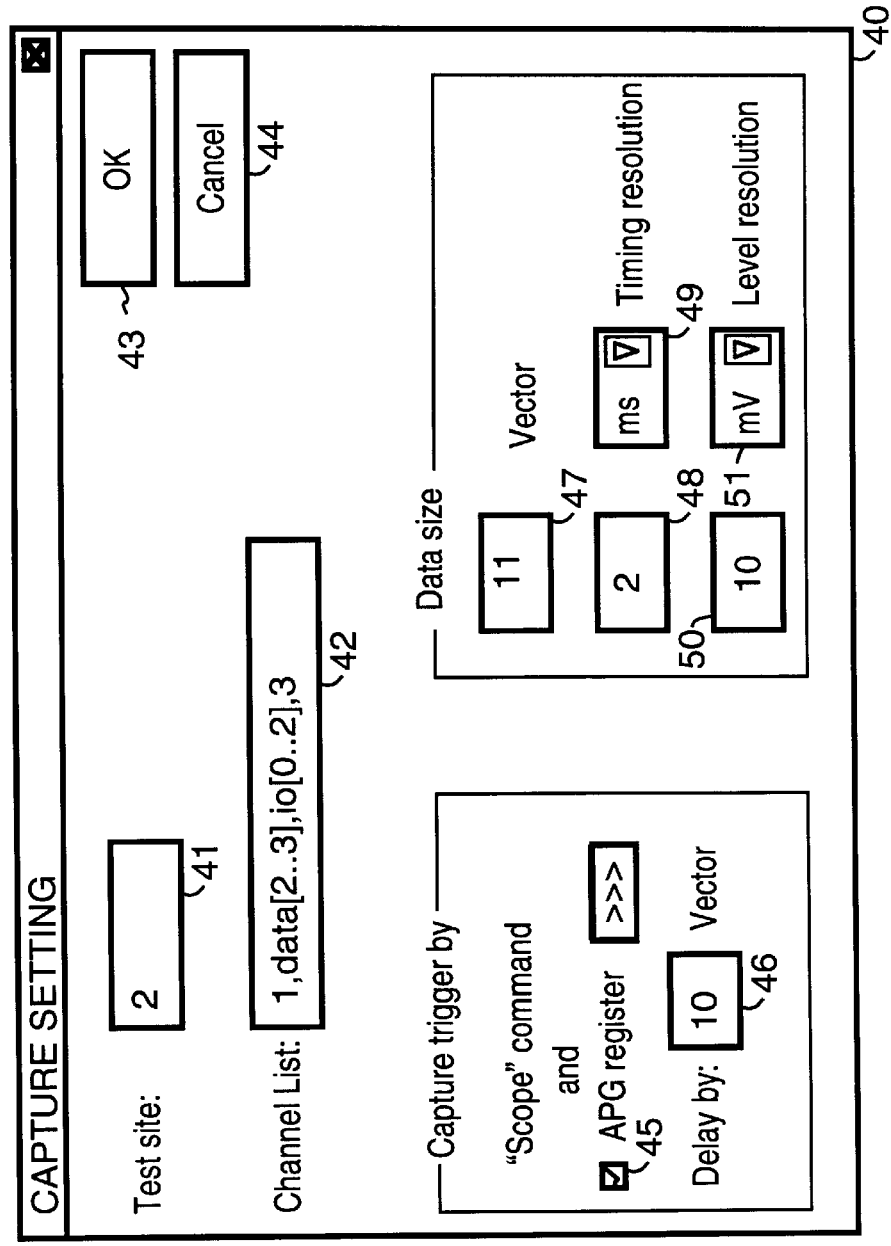
FIG. 2 shows a graphics user interface display of a window used for entering settings for capturing signals in accordance with a preferred embodiment of the present invention.

FIG. 2 shows a graphics user interface display of a window 40 used for entering settings for capturing signals for a DUT. In a box 41 a user selects a test site from which to obtain the data. In a box 42, the user indicates which channels (pins or pin groups), for which waveforms will be drawn.

A box 45 can be checked when the capture trigger is conditional upon the algorithmic pattern generator (APG) state. In a box 46, a user indicates how many test vectors are ignored before data is captured. In a box 47, the user indicates for how many test vectors data signals will be captured.

In a box 48, the user can specify a value for a timing resolution. In a box 49, the user can select units for the value placed in box 48. For example, in order to increase timing resolution, the test needs to be repeated and values on input/output pins of the DUT sampled at different locations within each test cycle (i.e., each input cycle and each output cycle). Thus, the higher the timing resolution, the longer it takes to obtain test results. Adjustment of timing resolution is necessary only in scope mode and logic analyzer mode, as defined below. A user can set timing resolution to be used as a default, even if scope mode and logic analyzer mode is not initially used. This allows the user to later recapture portions of the signal in scope mode or logic analyzer mode at the default setting without requiring the user to specify a value for timing resolution at the time of recapture.

In a box 50, the user can specify a value for voltage level resolution. In a box 51, the user can select units for the value placed in box 50. For example, in order to increase voltage level resolution, the test needs to be repeated and values on input/output pins of the DUT sampled against different compare voltages. Thus, the higher the voltage level resolution, the longer it takes to obtain test results. Adjustment of voltage resolution is necessary only in scope mode, as defined below. A user can set a voltage resolution to be used as a default, even if scope mode is not initially used. This allows the user to later recapture portions of the signal in scope mode at the default setting without requiring the user to specify a value for voltage resolution at the time of recapture.

An OK button 43 is used to confirm the capture settings indicated by the user using window 40. A cancel button 44 is used to cancel the capture settings indicated by the user using window 40.

Figure 3:
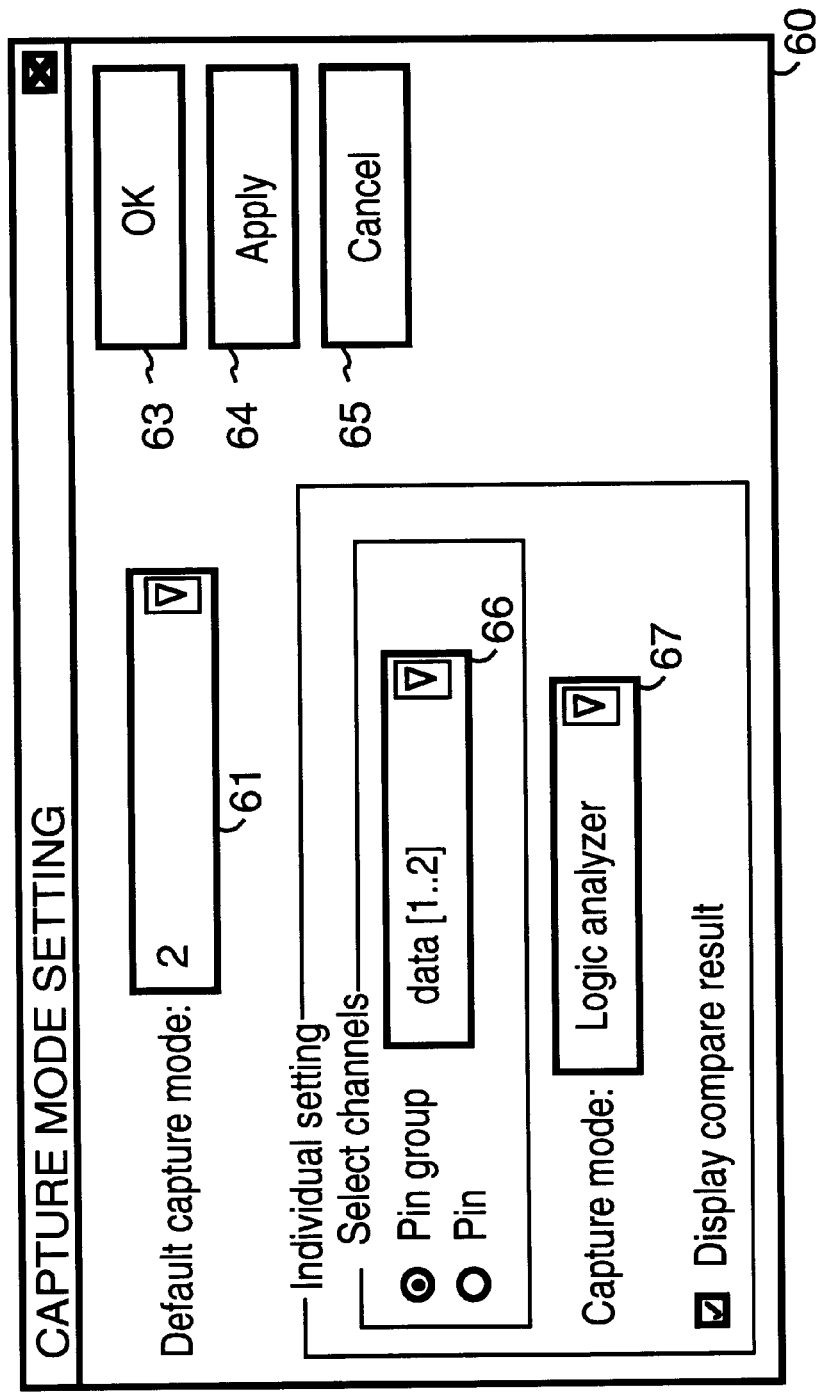
FIG. 3 shows a graphics user interface display of a window used for selecting a mode for capturing signals in accordance with a preferred embodiment of the present invention.

FIG. 3 shows a graphics user interface display of a window 60 used for indicating mode settings for capturing signals for a DUT. In a box 61, a user can specify a default mode for those channels that are not specifically set by a user. In a box 67, the user selects a mode. In a box 66 the user indicates which channels (pins or pin groups), for which the settings of box 67 apply. A user can use box 66 and box 67 in window 60 multiple times to allow for different settings to be assigned to different channels of pins and pin groups.

An OK button 63 is used to confirm the capture settings indicated by the user using window 60. An apply button 64 is used to apply the capture settings indicated by the user using window 60. A cancel button 65 is used to cancel the capture settings indicated by the user using window 60.

After the user has set up a capture using window 40 and window 60, the user can start a capture by issuing a capture command. This is done, for example, by selecting a start capture button, or selecting a start capture command on a pull-down menu.

In one embodiment of the present invention there are six modes. In each mode data is captured in different ways, as described below.

A reconstruction mode is used to obtain input information only. In the reconstruction mode, waveform display module 12 obtains and displays voltage values. The voltage values are produced by execution of test pattern files by the waveform display driver within the selected test site. The test pattern files, generated by APG 24, indicate test patterns to be placed on the pins of the DUT by the test site.

An expected data mode is used to obtain output information only. In the expected data mode, waveform display module 12 obtains and displays voltage values by obtaining expected results by executing the test pattern files. That is, the waveform display driver within the test site controller calculates what the DUT should, if operating properly, provide to output pins in response to the test patterns to be placed on the pins of the DUT by the test site.

A high speed mode is used to obtain output information only. In the high speed mode, the APG executes a test pattern file and causes the pin electronics to drive input and compare output on the pins of the DUT.

The pin electronics for each test site is run on a variable speed clock that is driven by the APG for the test site. Each cycle of the clock driven by the APG is a test cycle. For each test cycle, a new test instruction will execute. For example, if the test cycle is an input cycle, the pin electronics will drive input data on data pins and drive a write enable pin of the DUT during the input cycle. Alternatively, the pin electronics will drive input data on data pins in one input cycle and drive a write enable pin of the DUT during another input cycle. For example, if the test cycle is an output cycle, the pin electronics will drive an output enable of the DUT and the test site will compare output data received from the DUT with expected data within a single output cycle. Alternatively, the pin electronics will drive an output enable of the DUT on one output cycle and the test site will compare output data received from the DUT with expected data in another output cycle.

In high speed mode, the entire test is run once. For each output cycle, a single comparison is made for each expected output datum to determine whether the actual value on the pin of the DUT is a logic 1 (voltage output high (VOH)), a logic 0 (voltage output low (VOL)) or a high impedance (Hi-Z) as expected in the test pattern.

A logic analyzer mode is used to capture both input and output signals. In logic analyzer mode the waveforms are constructed by running the test multiple times, depending upon the timing resolution the user sets. Each time the test is run a single comparison is made for every test cycle. For each output cycle, a comparison is made to determine whether the output datum is a logic 1 (voltage output high (VOH)) or a logic 0 (voltage output low (VOL)). For each input cycle, a comparison is made on an input pin. For DUTs where the inputs are binary (either logic 1 or logic 0), a single comparison is sufficient to resolve the input. For DUTS where the input may have additional voltage levels (e.g., potential input voltage values are VHH, VIH, VIL and HIZ), it is necessary to run the test multiple times (since there is no capability to make multiple comparisons per input test cycle) in order to obtain proper resolution of input voltage values.

The number of times the test must be run depends on the timing resolution required. For example, if it is desired to have timing resolution equal to ⅕ the duration of a test cycle, it is necessary to run the test five times at different offsets from the beginning of each test cycle. This allows for binary voltage resolution of the inputs and outputs to the DUT.

Logic analyzer mode provides for "medium" speed data capture. More information is provided about the waveform transition timing, but there is minimal voltage resolution.

A scope mode is used to capture both input and output signals. The number of times each test must be run depends upon the timing resolution the user sets and the voltage resolution the user sets. Scope mode allows construction of waveforms with high timing resolution and high voltage resolution. Because of the high resolution, capture speed is slow.

For example, if it is desired to have timing resolution equal to ⅕ the duration of a test cycle and voltage resolution based on comparisons to three different voltages, it is necessary to run the test fifteen times. This allows comparisons for five different offsets at three different voltage levels for each test cycle.

An input/output (I/O) combined mode is a combination of the reconstruction mode for inputs to the DUT and the high speed mode for the outputs of the DUT. For pins used just for input to a DUT, waveform display module 12 obtains and displays voltage values by executing test pattern files. For pins used just for output from a DUT, waveform display module 12 constructs a waveform by single shot capture (as in the high speed mode). For the single shot capture, only one comparison is made on the signal for each output test cycle. Thus the time resolution and the voltage value resolution are only sufficient to determine whether a logic 0, a logic 1 or a high impedance (as expected in the test pattern) exists during a single output cycle. Since the timing resolution and the voltage value resolution are minimal, this allows for high speed capture of information. For pins used both for input and output, how a waveform is constructed is based on when data is being input to the DUT and when data is being output from the DUT. For portions of the waveform corresponding to input to the DUT, the waveform is constructed by executing test pattern files. For portions of the waveform corresponding to output from the DUT, the waveform is constructed by single shot capture.

Figure 4:
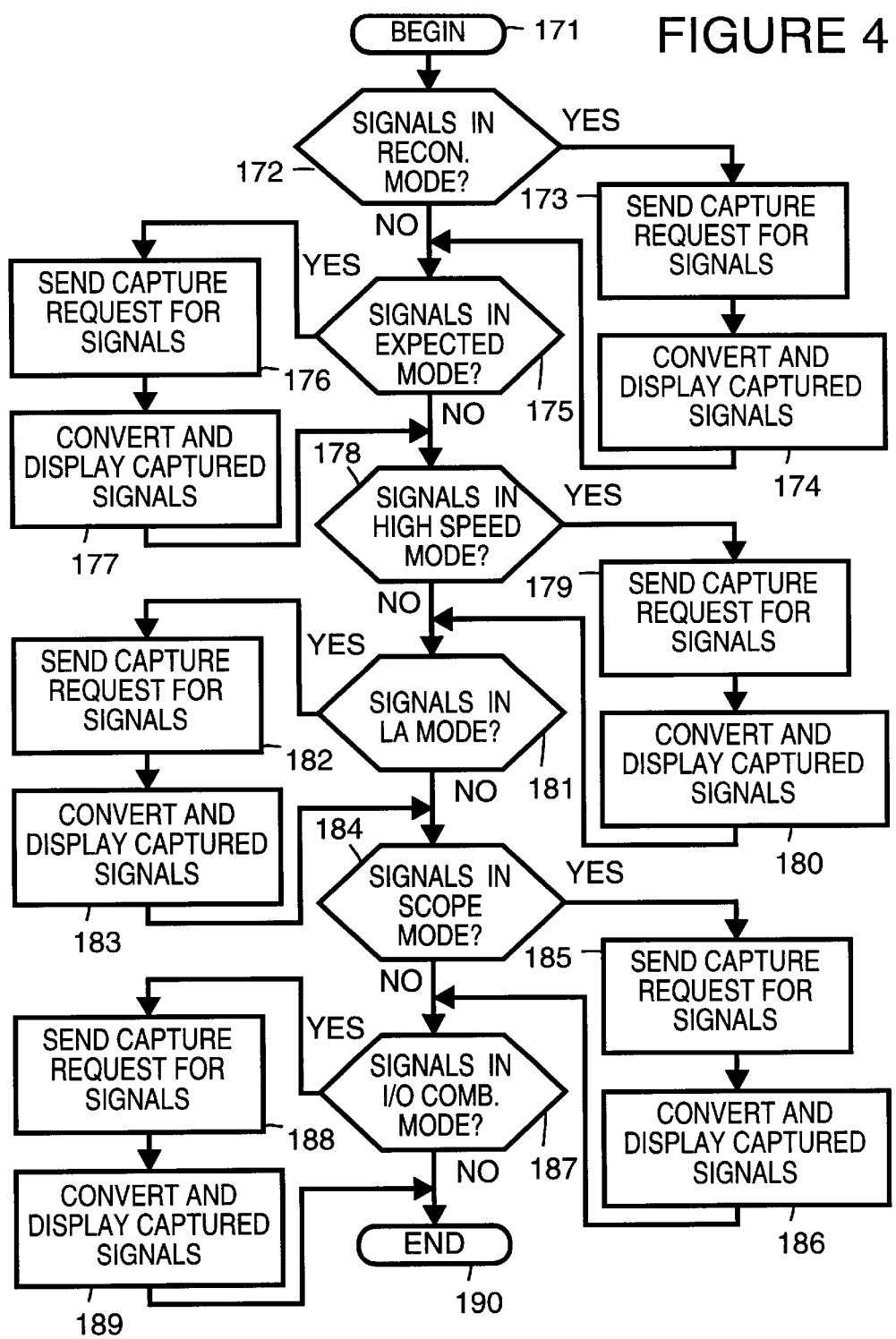
FIG. 4 is a simplified flowchart that illustrates operation of a waveform display module when displaying waveforms in accordance with a preferred embodiment of the present invention.

FIG. 4 is a simplified flowchart that illustrates operation of waveform display module 12 when a user has assigned different data gathering mechanisms to pins and/or groups of pins. The waveforms for all the pins are displayed together in a single image. This allows waveform display module 12 to respond to single setup by gathering data for all pins and progressively displaying the waveforms in the different modes selected by the user. Once waveform display module 12 completes the display process, all the waveforms requested by the user are simultaneously displayed on display 13.

In a block 171, waveform display module 12 begins a process to display waveforms requested by a user. In a block 172, waveform display module 12 checks to see if any of the signals are to be displayed in the reconstruction (RECON) mode. If so, in a block 173, waveform display module 12 sends a capture request to the selected test site for the signals to be displayed in RECON mode. Once the data on the input signals are received back, in a block 174, waveform display module 12 converts the units of the data to display coordinates and displays waveforms for the input signals on display 13. When returning data to waveform display module 12, the test site marks the output signals as unknown.

In a block 175, waveform display module 12 checks to see if any of the signals are to be displayed in the expected mode. If so, in a block 176, waveform display module 12 sends a capture request to the selected test site for the signals to be displayed in expected mode. Once the data on the output signals are received back, in a block 177, waveform display module 12 converts the units of the data to display coordinates and displays waveforms for the output signals on display 13. When returning data to waveform display module 12, the test site marks the input signals as invalid. The display is cumulative so that the waveforms are displayed in addition to the waveforms that were displayed at block 174. When displaying data, waveform display module will use insertion of waveforms as necessary in order to keep the waveforms in the order requested by user.

In a block 178, waveform display module 12 checks to see if any of the signals are to be displayed in the high speed mode. If so, in a block 179, waveform display module 12 sends a capture request to the selected test site for the output signals to be displayed in high speed mode. Once the data on the output signals are received back, in a block 180, waveform display module 12 converts the units of the data to display coordinates and displays waveforms for the output signals on display 13. When returning data to waveform display module 12, the test site marks the input signals as invalid. When displaying data, waveform display module will use insertion of waveforms as necessary in order to keep the waveforms in the order requested by user.

In a block 181, waveform display module 12 checks to see if any of the signals are to be displayed in the logic analyzer (LA) mode. If so, in a block 182, waveform display module 12 sends a capture request to the selected test site controller for the signals to be displayed in the logic analyzer mode. The capture request includes the timing resolution indicated by the user. Once the data on the signals are received back, in a block 183, waveform display module 12 converts the units of the data to display coordinates and displays waveforms for the signals on display 13. When displaying data, waveform display module will use insertion of waveforms as necessary in order to keep the waveforms in the order requested by user.

In a block 184, waveform display module 12 checks to see if any of the signals are to be displayed in the scope mode. If so, in a block 185, waveform display module 12 sends a capture request to the selected test site controller for the signals to be displayed in the scope mode. The capture request includes the timing resolution and the voltage resolution indicated by the user. Once the data on the signals are received back, in a block 186, waveform display module 12 converts the units of the data to display coordinates and displays waveforms for the signals on display 13.

In a block 187, waveform display module 12 checks to see if any of the signals are to be displayed in the I/O combined mode. If so, in a block 188, waveform display module 12 sends a capture request to the selected test site controller for the signals to be displayed in I/O combined mode. Once the data on the signals are received back, in a block 189, waveform display module 12 converts the units of the data to display coordinates and displays waveforms for the signals on display 13. In I/O mode, the data processing module of the test site controller for the selected test site indicates which part of the signals are for input and which part are for output. This allows waveform display module 12 to indicate to a user which part of the waveform represents input to the DUT and which part of the waveform represents output from the DUT.

In a block 190, waveform display module 12 has completed display of the waveforms.

Figure 5:
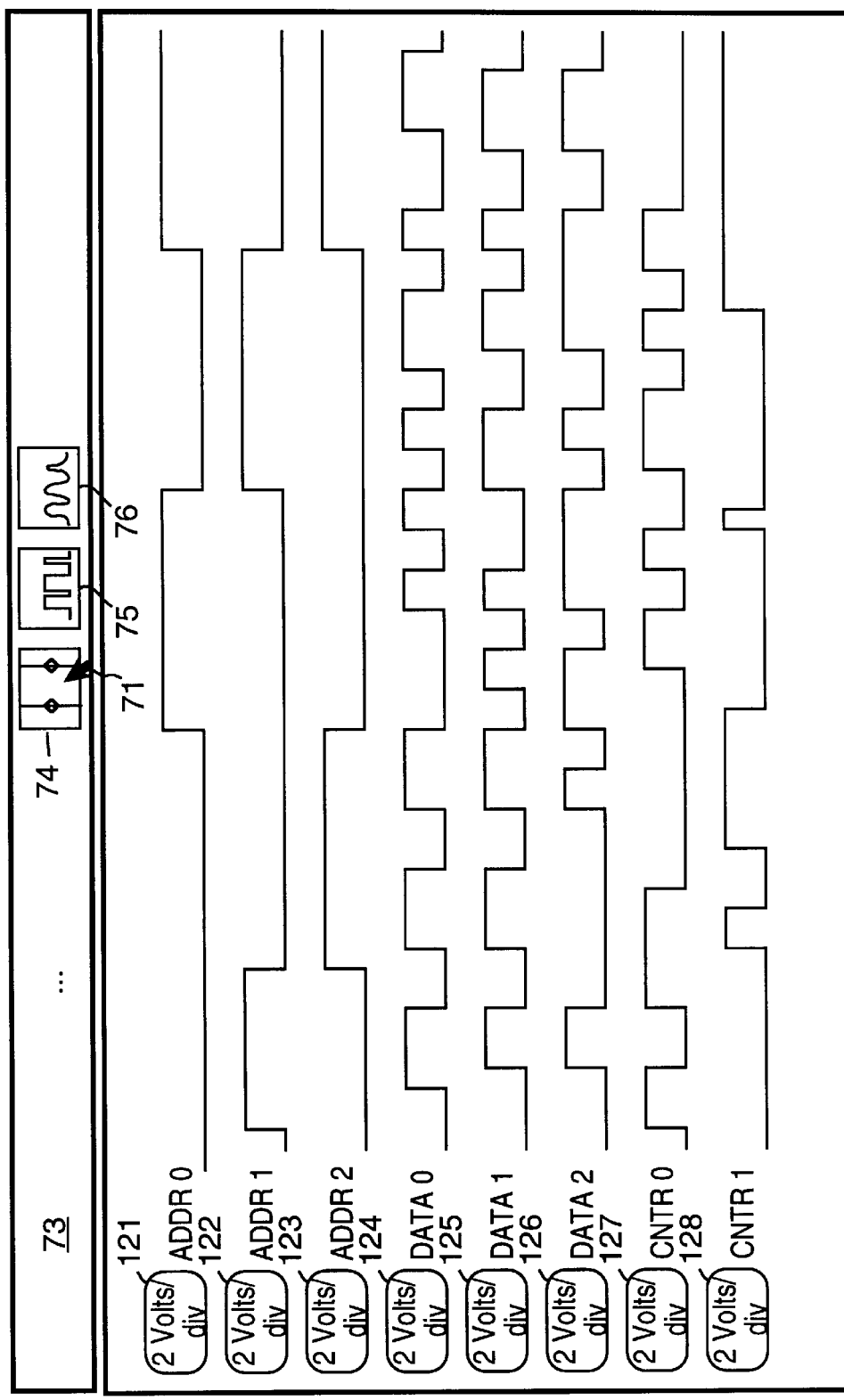
FIG. 5 shows a simplified display of waveforms captured in an input/output (I/O) combined mode in accordance with a preferred embodiment of the present invention.

In FIG. 5 a simplified example of waveforms captured in an I/O combined mode is displayed in simplified form by waveform display module 12 on display 13. The signals ADDR 0, ADDR 1 and ADDR 2 are signals from pins used just for input to a DUT. Waveform display module 12 obtains logic values by executing test pattern files and displays corresponding voltage values for these waveforms.

The signals DATA 0, DATA 1, DATA 2, CNTR 0 and CNTR 1 are signals from pins used both for input to and output from a DUT. For portions of the waveform corresponding to input to the DUT, waveform display module 12 constructs the waveform by executing test pattern files. For portions of the waveform corresponding to output from the DUT, waveform display module 12 constructs the waveform by single shot capture.

On display 13 is also displayed a menu bar 73. Shown in menu bar 73 are a button 74, a button 75 and a button 76. Menu bar 73 typically includes other buttons (not shown). Button 74 is a "trigger cursor on/off" button that is used to turn on vertical cursors. Button 75 is used to recapture a selected portion of a waveform in logic analyzer mode. Button 76 is used to recapture a selected portion of a waveform in scope mode. In one preferred embodiment, button 75 is omitted. In this case, recapture is only allowed in scope mode Values for timing resolution and voltage level resolution for recapture can be selected by selecting a button immediately to the right of the channel label. For the example shown in FIG. 5, in order to adjust timing and/or voltage resolution for recapture of signal ADDR 0, button 121 is used. Button 121 indicates that currently ADDR 0 is displayed at 2 volts per division. In order to adjust timing and/or voltage resolution for recapture of signal ADDR 1, button 122 is used. Button 122 indicates that currently ADDR 1 is displayed at 2 volts per division. In order to adjust timing and/or voltage resolution for recapture of signal ADDR 2, button 123 is used. Button 123 indicates that currently ADDR 2 is displayed at 2 volts per division. In order to adjust timing and/or voltage resolution for recapture of signal DATA 0, button 124 is used. Button 124 indicates that currently DATA 0 is displayed at 2 volts per division. In order to adjust timing and/or voltage resolution for recapture of signal DATA 1, button 125 is used. Button 125 indicates that currently DATA 1 is displayed at 2 volts per division. In order to adjust timing and/or voltage resolution for recapture of signal DATA 2, button 126 is used. Button 126 indicates that currently DATA 2 is displayed at 2 volts per division. In order to adjust timing and/or voltage resolution for recapture of signal CNTR 0, button 127 is used. Button 127 indicates that currently CNTR 0 is displayed at 2 volts per division. In order to adjust timing and/or voltage resolution for recapture of signal CNTR 1, button 128 is used. Button 128 indicates that currently CNTR 1 is displayed at 2 volts per division.

A cursor 71 is used to select a button. For example, when cursor 71 is used to select one of buttons 121 through 128 with a single click of a pointing device (e.g., mouse or trackpad), this selects the channel. When cursor 71 is used to select one of buttons 121 through 128 with a double click of a pointing device, this brings up a resolution window 80 shown in FIG. 6.

It is necessary to use resolution window 80 shown only when it is desired to change default settings for timing resolution and/or voltage resolution preselected using window 40 (shown in FIG. 2).

Figure 6:
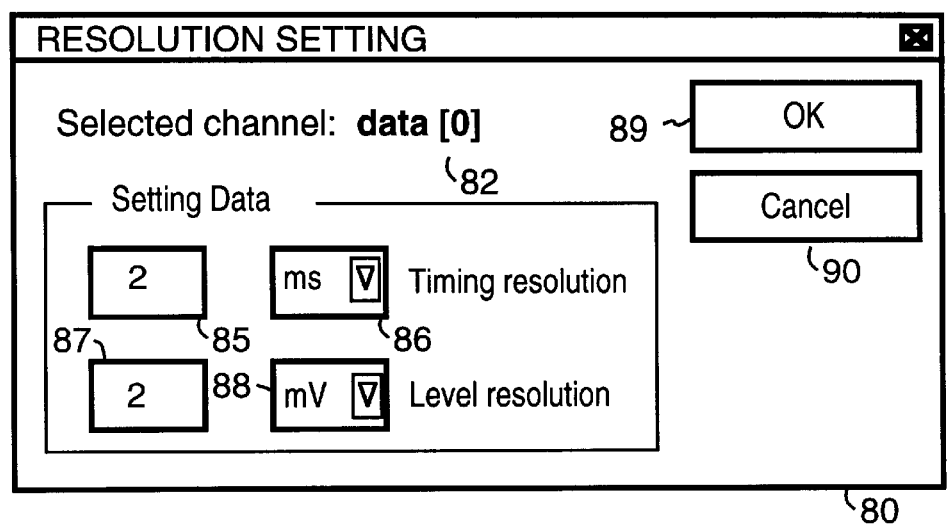
FIG. 6 shows a graphics user interface display of a window used for selecting timing and voltage resolution for a waveform in accordance with an alternate embodiment of the present invention.

FIG. 6 shows an example of a resolution window 80 brought up by a user using cursor 71 to select and double click (a "double click" selection) on button 124. Within window 80, an indication 82 indicates that the selected channel is for data[0]. In a box 85, the user can specify a value for a timing resolution. In a box 86 the user can select units for the value placed in box 85. Adjustment of timing resolution is used for scope mode and logic analyzer mode, as defined above. In a box 87, the user can specify a value for voltage level resolution. In a box 88, the user can select units for the value placed in box 87. Adjustment of voltage resolution is necessary only in scope mode, as defined above.

An OK button 89 is used to confirm the recapture settings indicated by the user using window 80. A cancel button 90 is used to leave the current settings unchanged.

For example, a user uses box 87 to select a new voltage resolution of 2 mV per second. The user then selects OK button 89.

Figure 7:
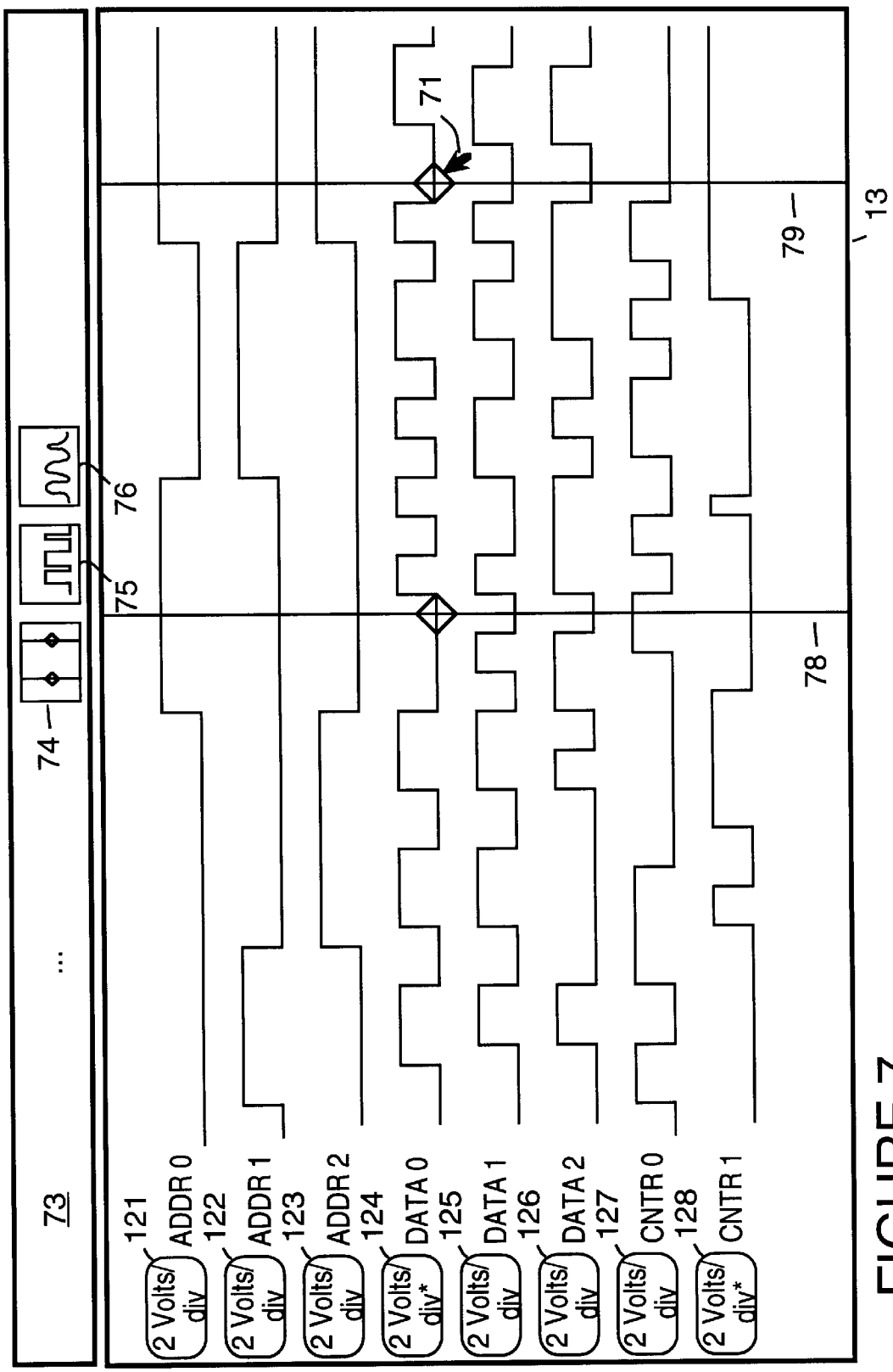
FIG. 7 shows a simplified display of waveforms including a portion of two waveforms selected for recapture in accordance with a preferred embodiment of the present invention.

FIG. 7 shows the results after the user has selected OK button 89 and performed the following additional actions. The user has made a "single click" selection of button 124 resulting in DATA 0 being selected (as indicated by the "*" within button 124). The user has made a "double click" selection of button 128 and selected a new voltage resolution of 2 mV per second for signal CNTR 1. The user has made a "single click" selection of button 128 resulting in signal CNTR 1 being selected (as indicated by the "*" within button 128). The user has made a "single click" selection of button 74 resulting in the appearance of a vertical cursor 78 and a vertical cursor 79.

Vertical cursor 78 and vertical cursor 79 are used to delineate for recapture a portion of each of the selected signal waveforms. A user can move the horizontal position of either vertical cursor by using cursor 71 to select a diamond portion of the vertical cursor. In a preferred embodiment, vertical cursors snap to the nearest vector boundary. By positioning vertical cursor 78 and vertical cursor 79, a user indicates a portion of the selected waveforms (e.g., DATA 0 and CNTR 1) to be recaptured.

Selecting button 75 results in immediate recapture of the selected portion of the selected waveforms in logic analyzer mode at a preselected timing resolution. Selecting button 76 results in immediate recapture of the selected portion of the waveforms in scope mode at a preselected timing resolution and a preselected voltage resolution.

For the recapture, waveform display module 12 (shown in FIG. 1) sends a request to the selected test site for the recaptured data. The test site controller returns the recaptured data. The recaptured data is then displayed by waveform display module 12 on display 13.

Figure 8:
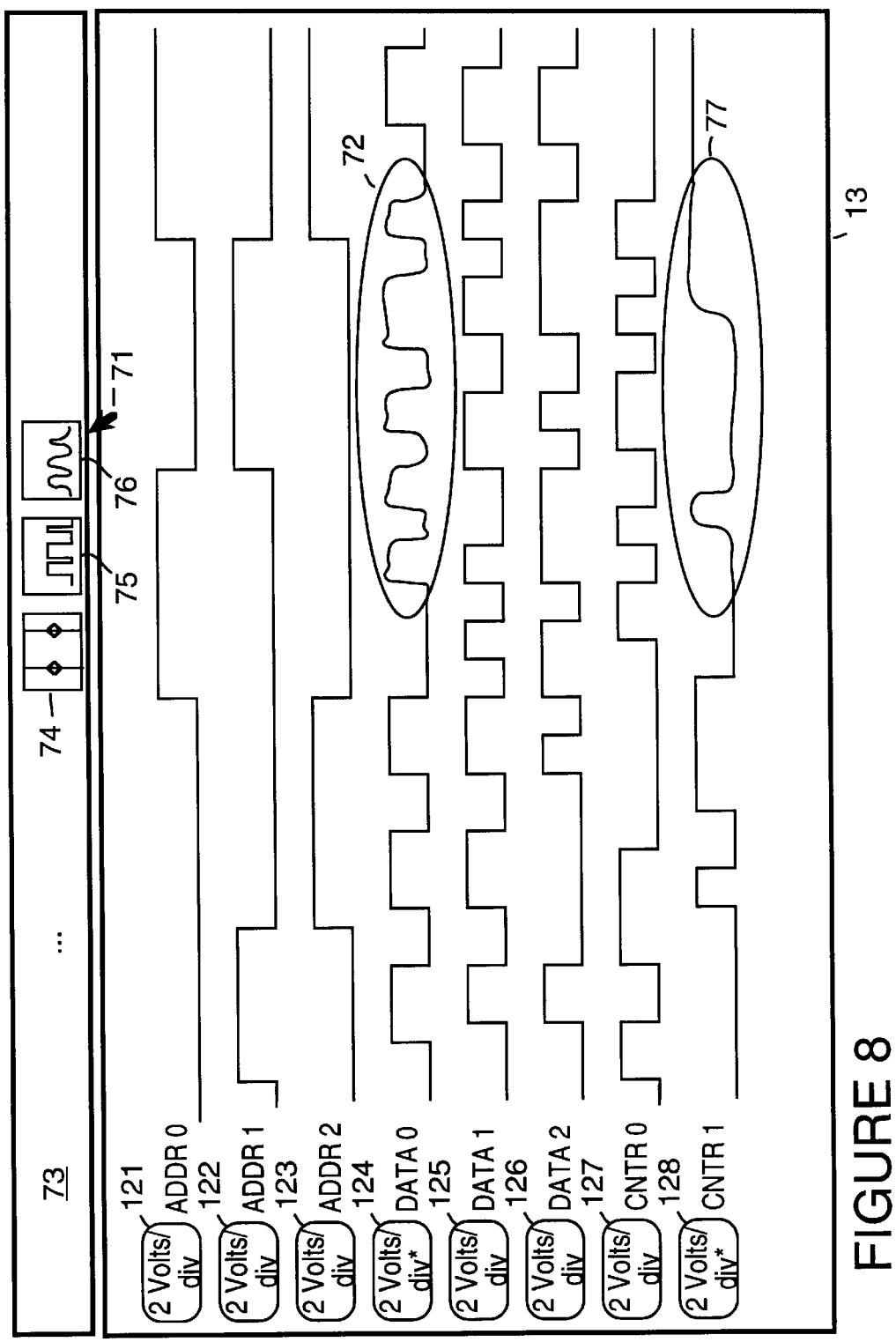
FIG. 8 shows a simplified display of waveforms including a portion of two waveforms recaptured in accordance with a preferred embodiment of the present invention.

FIG. 8 shows the result when, from the Display shown in FIG. 7, a user selects scope mode button 76. The portion of the DATA 0 signal delineated by vertical cursor 78 and vertical cursor 79 and the portion of the CNTR 1 signal delineated by vertical cursor 78 and vertical cursor 79 are recaptured in scope mode. An oval 72 shown in FIG. 8 marks the recaptured portion of DATA 0. An oval 77 shown in FIG. 8 marks the recaptured portion of CNTR 1. Only the delineated portion of the selected waveforms are recaptured. The remaining portions of the waveforms are displayed as they were originally captured.

The existence of a recapture feature such as described above frees a user to generate a display of a lot of low-resolution waveform data in an initial quick pass. The user can then use the recapture feature to obtain detail on particular portions of waveforms of particular interest.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for displaying a waveform for an input/output signal for a device under test (DUT), the method comprising the following steps:
   (a) capturing data for the input/output signal in accordance with a first data capturing mechanism;
   (b) displaying the waveform for the input/output signal using the data captured in step (a);
   (c) providing a user with an interface that allows the user to select a portion of the waveform for recapture using a second data capturing mechanism;
   (d) recapturing data for a portion of the input/output signal, corresponding to the portion of the waveform selected for recapture, the recapturing of data being performed using the second data capturing mechanism; and,
   (e) redisplaying the waveform for the input/output signal, including the following substeps:
      (e.1) using the data recaptured in step (d) using the second data capturing mechanism for displaying the portion of the waveform selected for recapture, and
      (e.2) using the data captured in step (a) in accordance with the first data capturing mechanism for displaying remaining portions of the waveform not selected for recapture.

2. A method as in claim 1 wherein in step (c) wherein the interface allows the user to select the portion of the waveform for recapture by allowing the user to delineate the portion of the waveform for recapture.

3. A method as in claim 1 wherein the second data capturing mechanism allows the user to adjust timing resolution for recapture.

4. A method as in claim 1 wherein the second data capturing mechanism allows the user to adjust timing resolution for recapture and to adjust voltage level resolution for recapture.

5. A method as in claim 1 wherein in step (c) the interface allows the user to graphically select the portion of the waveform for recapture.

6. A method for displaying waveforms of input/output signals for a device under test (DUT), the method comprising the following steps:
   (a) capturing data for the input/output signals in accordance with a first data capturing mechanism;
   (b) displaying waveforms for the input/output signals;
   (c) providing a user with an interface that allows the user to select a portion of a first waveform for recapture using a second data capturing mechanism;
   (d) recapturing data for a portion of a first input/output signal, corresponding to the portion of the first waveform selected for recapture, the recapturing of data being performed using the second data capturing mechanism; and,
   (e) redisplaying the first waveform for the input/output signal, including the following substeps:
      (e.1) using the data recaptured in step (d) using the second data capturing mechanism for displaying the portion of the first waveform selected for recapture, and
      (e.2) using the data captured in step (a) in accordance with the first data capturing mechanism for displaying remaining portions of the first waveform not selected for recapture.

7. A method as in claim 6 wherein in step (c) wherein the interface allows the user to select a portion of the first waveform for recapture by allowing the user to delineate the portion of the first waveform for recapture.

8. A method as in claim 6 wherein the second data capturing mechanism allows a user to adjust timing resolution for recapture.

9. A method as in claim 6 wherein the second data capturing mechanism allows a user to adjust timing resolution for recapture and to adjust voltage level resolution for recapture.

10. A method as in claim 6 wherein in step (c) the interface allows the user to graphically select the portion of the first waveform for recapture.

11. A testing system used to test a device under test (DUT), comprising:
    a tester component that controls testing of a DUT, the tester component capturing data for a input/output signal in accordance with a first data capturing mechanism; and,
    a waveform display module that displays a waveform for the input/output signal using the data captured by the tester component, the waveform display module providing a user with an interface that allows the user to select a portion of the waveform for recapture using a second data capturing mechanism;

wherein in response to the user selecting the portion of the waveform for recapture, the testing component uses the second data capturing mechanism to recapture data for a portion of the input/output signal, corresponding to the portion of the waveform selected for recapture, the waveform display module redisplaying the waveform for the input/output signal so that the portion of the waveform selected for recapture, is displayed using the data recaptured by the testing component and remaining portions of the waveform not selected for recapture are displayed using the data captured by the tester component in accordance with the first data capturing mechanism.

12. A testing system as in claim 11 wherein the waveform display module allows the user to select a portion of the first waveform for recapture by allowing the user to delineate the portion of the first waveform for recapture.

13. A testing system as in claim 11 wherein the second data capturing mechanism allows a user to adjust timing resolution for recapture.

14. A testing system as in claim 11 wherein the second data capturing mechanism allows a user to adjust timing resolution for recapture and to adjust voltage level resolution for recapture.

15. A testing system as in claim 11 wherein the interface allows the user to graphically select the portion of the waveform for recapture.

16. A testing system used to test a device under test (DUT), comprising:

a tester component means for controlling testing of a DUT, the tester component means capturing data for a input/output signal in accordance with a first data capturing mechanism; and, a waveform display module means for displaying a waveform for the input/output signal using the data captured by the tester component means, the waveform display module means providing a user with an interface that allows the user to select a portion of the waveform for recapture using a second data capturing mechanism;

wherein in response to the user selecting the portion of the waveform for recapture, the testing component uses the second data capturing mechanism to recapture data for a portion of the input/output signal, corresponding to the portion of the waveform selected for recapture, the waveform display module redisplaying the waveform for the input/output signal so that the portion of the waveform selected for recapture, is displayed using the data recaptured by the testing component and remaining portions of the waveform not selected for recapture are displayed using the data captured by the tester component means in accordance with the first data capturing mechanism.

17. A testing system as in claim 16 wherein the waveform display module means allows the user to select a portion of the first waveform for recapture by allowing the user to delineate the portion of the first waveform for recapture.

18. A testing system as in claim 16 wherein the second data capturing mechanism allows a user to adjust timing resolution for recapture.

19. A testing system as in claim 16 wherein the second data capturing mechanism allows a user to adjust timing resolution for recapture and to adjust voltage level resolution for recapture.

20. A testing system as in claim 16 wherein the interface allows the user to graphically select the portion of the waveform for recapture.

* * * * *